US010642158B2

(12) United States Patent
Cho et al.

(10) Patent No.: US 10,642,158 B2
(45) Date of Patent: May 5, 2020

(54) METHOD OF CONTROLLING RETICLE MASKING BLADE POSITIONING TO MINIMIZE IMPACT ON CRITICAL DIMENSION UNIFORMITY AND DEVICE FOR CONTROLLING RETICLE MASKING BLADE POSITIONING

(71) Applicant: TAIWAN SEMICONDUCTOR MANUFACTURING CO., LTD., Hsinchu (TW)

(72) Inventors: Hung-Wen Cho, Hsinchu (TW); Fu-Jye Liang, Zhubei (TW); Chun-Kuang Chen, Guanxi Township (TW); Chih-Tsung Shih, Hsinchu (TW); Li-Jui Chen, Hsinchu (TW); Po-Chung Cheng, Chiayi County (TW); Chin-Hsiang Lin, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/151,300

(22) Filed: Oct. 3, 2018

(65) Prior Publication Data

US 2019/0163046 A1 May 30, 2019

Related U.S. Application Data

(60) Provisional application No. 62/592,728, filed on Nov. 30, 2017, provisional application No. 62/592,118, filed on Nov. 29, 2017.

(51) Int. Cl.
*G03F 7/20* (2006.01)

(52) U.S. Cl.
CPC ........ *G03F 7/70066* (2013.01); *G03F 7/7085* (2013.01)

(58) Field of Classification Search
CPC .................................................. G03F 7/70066
See application file for complete search history.

(56) References Cited

U.S. PATENT DOCUMENTS 5,486,896 A * 1/1996 Hazama .............. G03F 7/70058
355/53
6,453,000 B1 * 9/2002 Terashima .......... G03F 7/70066
378/205

(Continued)

OTHER PUBLICATIONS

David C. Brandt et al., "LPP Source System Development for HVM," Proc. of SPIE, vol. 7271, pp. 727103-1 to 727103-10 (Mar. 2010).
Renisi "Interferometry Explained," Retrieved from http://www.renishaw.com/en/interferometry-explained—7854 on Nov. 16, 2017.
"Feedback." Wikipedia: The Free Encyclopedia, Retrieved from the internet https://en.wikipedia.org/wiki/Feedback on Nov. 16, 2017.

(Continued)

*Primary Examiner* — Steven Whitesell Gordon
(74) *Attorney, Agent, or Firm* — McDermott Will & Emery LLP

(57) ABSTRACT

A method of controlling reticle masking blade positioning to minimize the impact on critical dimension uniformity includes determining a target location of a reticle masking blade relative to a reflective reticle and positioning the reticle masking blade at the target location. A position of the reticle masking blade is monitored during an imaging operation. The position of the reticle masking blade is compared with the target location and the position of the reticle masking blade is adjusted if the position of the reticle masking blade is outside a tolerance of the target location.

20 Claims, 15 Drawing Sheets

(56) References Cited

U.S. PATENT DOCUMENTS

| | | | | |
|---|---|---|---|---|
| 6,463,119 | B1* | 10/2002 | Terashima | G03F 7/70066 378/34 |
| 8,796,666 | B1 | 8/2014 | Huang et al. | |
| 9,093,530 | B2 | 7/2015 | Huang et al. | |
| 9,184,054 | B1 | 11/2015 | Huang et al. | |
| 9,256,123 | B2 | 2/2016 | Shih et al. | |
| 9,529,268 | B2 | 12/2016 | Chang et al. | |
| 9,548,303 | B2 | 1/2017 | Lee et al. | |
| 9,618,837 | B2 | 4/2017 | Lu et al. | |
| 9,869,928 | B2 | 1/2018 | Huang et al. | |
| 9,869,934 | B2 | 1/2018 | Huang et al. | |
| 9,869,939 | B2 | 1/2018 | Yu et al. | |
| 2003/0180632 | A1* | 9/2003 | Eurlings | B82Y 10/00 430/5 |
| 2005/0157285 | A1* | 7/2005 | Schothorst | G03F 7/70066 355/71 |
| 2005/0162629 | A1* | 7/2005 | Moors | G03F 7/70483 355/67 |
| 2005/0237503 | A1* | 10/2005 | Kubo | G03F 7/70691 355/53 |
| 2007/0146673 | A1* | 6/2007 | Terashi | G03F 7/70066 355/67 |
| 2009/0257042 | A1* | 10/2009 | Komatsuda | G03F 7/70066 355/71 |
| 2009/0310110 | A1* | 12/2009 | Tai | G03B 27/42 355/53 |
| 2010/0002220 | A1* | 1/2010 | Tanaka | G03F 7/70066 355/71 |
| 2012/0075610 | A1* | 3/2012 | Dierichs | G03F 7/70066 355/67 |
| 2013/0286374 | A1 | 10/2013 | Boogaard et al. | |
| 2014/0377692 | A1* | 12/2014 | Patra | G03F 7/70475 430/5 |
| 2016/0077441 | A1* | 3/2016 | Kugler | G02B 7/1828 355/71 |

OTHER PUBLICATIONS

"Control Systems/Feedback Loops." Wikipedia: The Free Encyclopedia, Retrieved from the internet https://en.wikibooks.org/wiki/Control_Systems/Feedback_Loops on Nov. 16, 2017.

"Extreme Ultraviolet Lithography." Wikipedia: The Free Encyclopedia, Retrieved from the internet https://en.wikipedia.org/wiki/Extreme_ultraviolet_lithography on Sep. 20, 2017.

"Extreme Ultraviolet." Wikipedia: The Free Encyclopedia, Retrieved from the internet https://en.wikipedia.org/wiki/Extreme_ultraviolet on Oct. 15, 2017.

"Photomask." Wikipedia: The Free Encyclopedia, Retrieved from the internet https://en.wikipedia.org/wiki/Photomask on Oct. 25, 2017.

"Numerical Aperture." Wikipedia: The Free Encyclopedia, Retrieved from the internet https://en.wikipedia.org/wiki/Numerical_aperture on Nov. 15, 2017.

"Position Sensor." Wikipedia: The Free Encyclopedia, Retrieved from the internet https://en.wikipedia.org/wiki/Position_sensor on Nov. 21, 2017.

"Interferometry." Wikipedia: The Free Encyclopedia, Retrieved from the internet https://en.wikipedia.org/wiki/Interferometry on Nov. 16, 2017.

"Interferometers." RP Photonics Encyclopedia, Retrieved from the internet https://www.rp-photonics.com/interferometers.html on Nov. 21, 2017.

Mark Lapedus, "Next EUV Challenge: Pellicles" Semiconductor Engineering, Retrieved from the internet https://semiengineering.com/next-euv-challenge-pellicles/ (Apr. 27, 2016).

Oktay Yildirim et al., "Improvements in resist performance towards EUV HVM," Proceedings vol. 10143, Extreme Violet (EUV) Lithography VIII; 101430Q (2017).

Chris Maloney, "Compensation of Extreme Ultraviolet Lithography Image Field Edge Effects Through Optical Proximity Correction," Rochester Institute of Technology, Thesis, Retrieved at https://scholarworks.rit.edu/theses/7632/ (Published Feb. 2014).

* cited by examiner

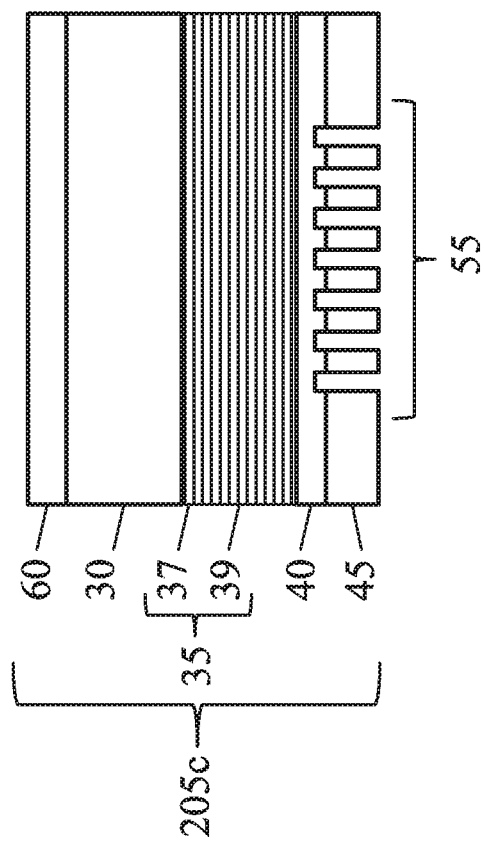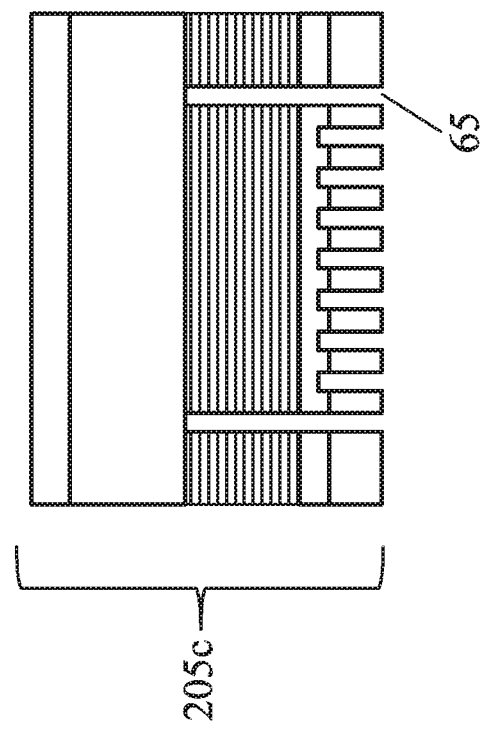

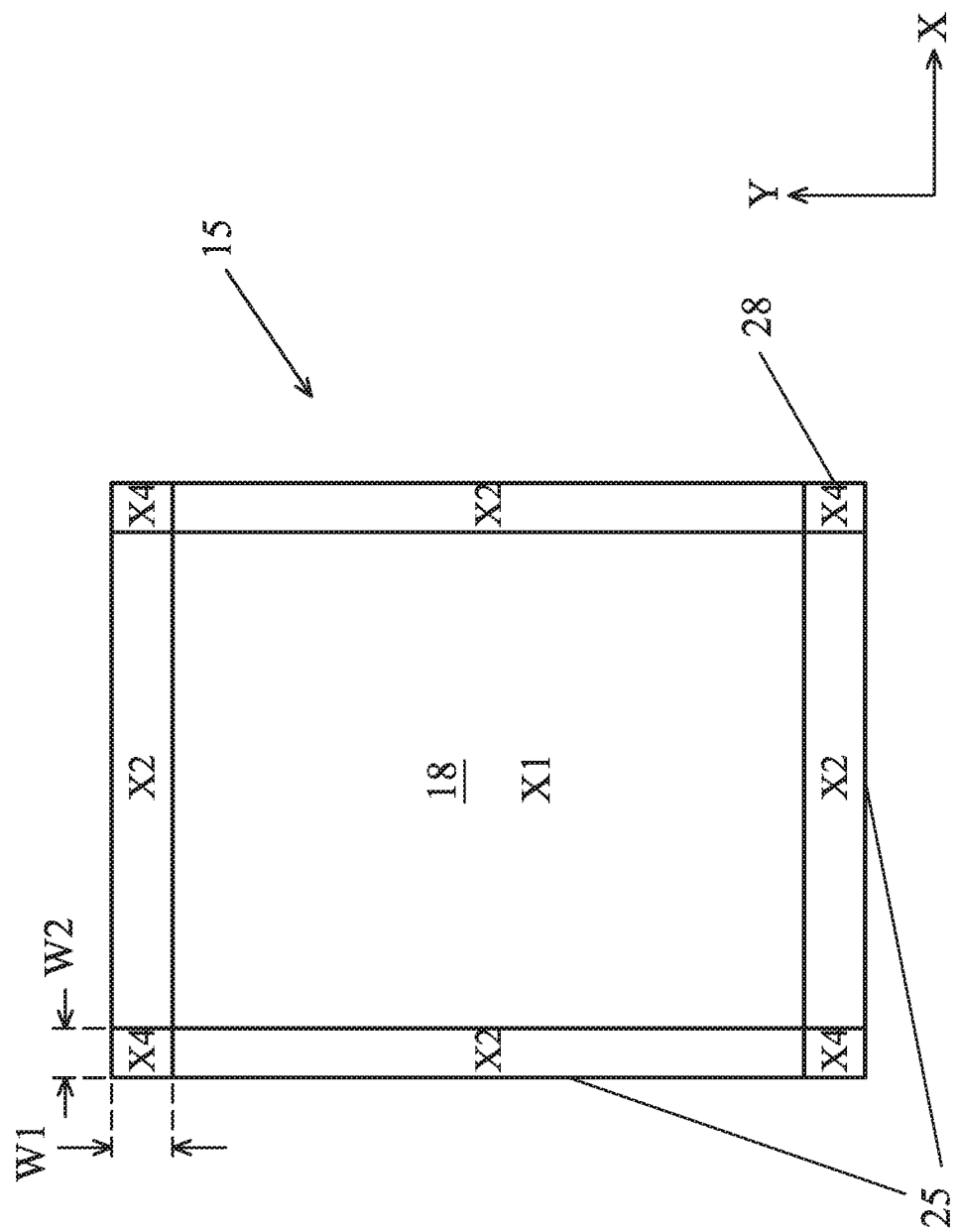

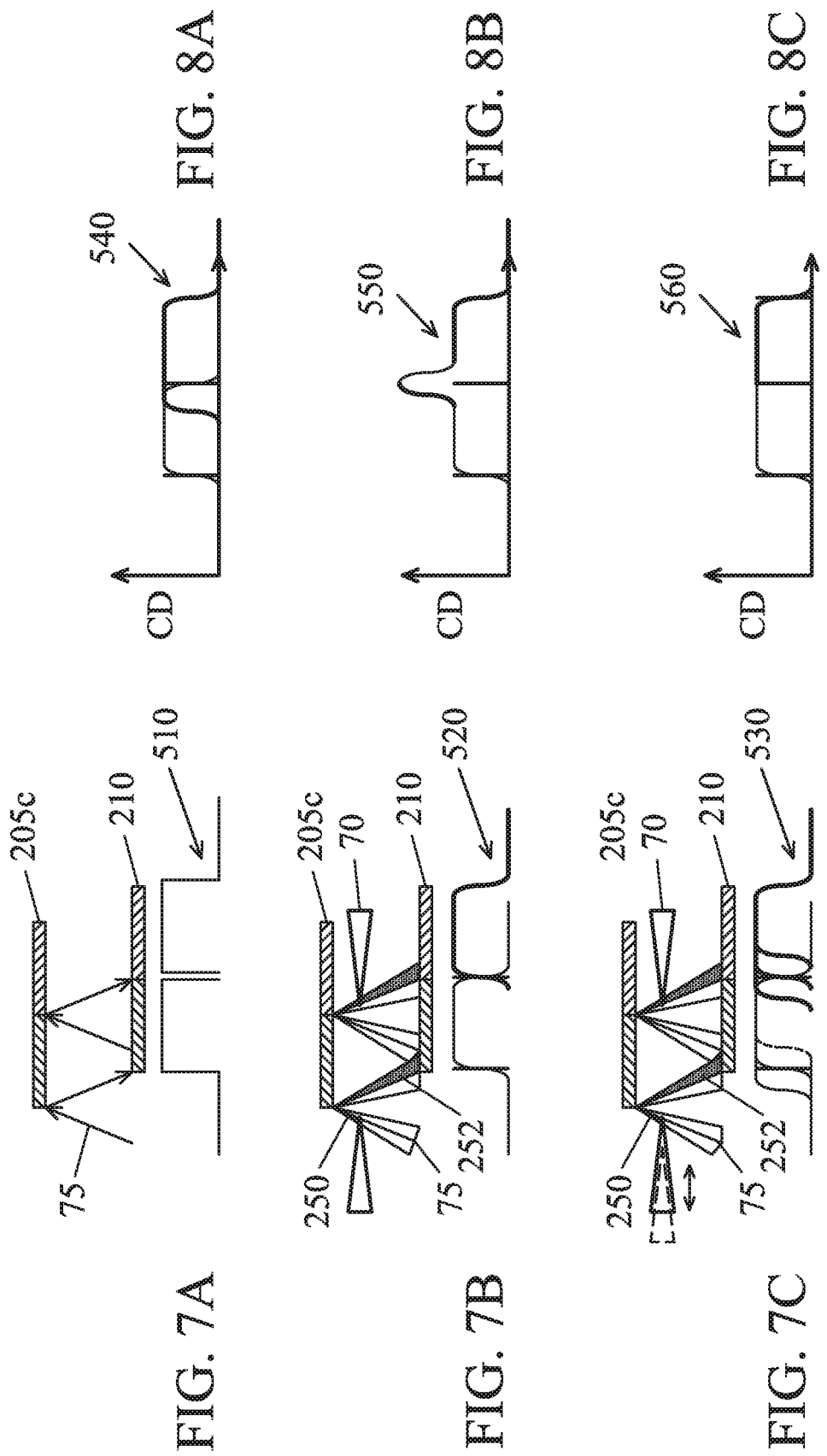

METHOD OF CONTROLLING RETICLE MASKING BLADE POSITIONING TO MINIMIZE IMPACT ON CRITICAL DIMENSION UNIFORMITY AND DEVICE FOR CONTROLLING RETICLE MASKING BLADE POSITIONING

CROSS REFERENCE TO RELATED APPLICATIONS

This application claims priority to U.S. Provisional Patent Application No. 62/592,118, filed Nov. 29, 2017 and U.S. Provisional Application No. 62/592,728, filed on Nov. 30, 2017, the entire disclosure of each are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm. Lithography resolution is negatively impacted by diffraction.

Optical proximity correction (OPC) is a photolithography enhancement technique used to compensate for image errors due to diffraction or process effects. The need for OPC is due to the limitations of light to maintain the edge placement integrity of the original design, after processing, into the etched image on the silicon wafer. These projected images appear with irregularities such as line widths that are narrower or wider than designed, these are amenable to compensation by changing the pattern on the photomask used for imaging. Other distortions such as rounded corners are driven by the resolution of the optical imaging tool and are harder to compensate for. Such distortions, if not corrected, may alter the electrical properties of as fabricated devices. Optical proximity correction corrects these errors by moving edges or adding extra polygons to the pattern written on the photomask. Optical proximity correction may use pre-computed look-up tables based on width and spacing between features (known as rule based OPC) or use compact models to dynamically simulate the final pattern and thereby drive the movement of edges, typically broken into sections, to find the best solution (known as model based OPC).

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 is a cross-sectional view of a reflective reticle used in embodiments of the disclosure.

FIG. 4 is a cross-sectional view of a reflective reticle used in embodiments of the disclosure.

FIG. 6 is a plan view of a central exposed region on a semiconductor substrate according to embodiments of the disclosure.

FIG. 7A is schematic view of an ideal extreme ultraviolet exposure operation. FIG. 7B is a schematic view of an extreme ultraviolet exposure operation including fixed reticle masking blades. FIG. 7C is a schematic view of an extreme ultraviolet exposure operation where the reticle masking blade position varies.

FIG. 8A is a schematic view showing the extreme ultraviolet exposure versus the critical dimension of the pattern feature. FIG. 8B is a schematic view showing the cumulative extreme ultraviolet exposure versus the critical dimension of the pattern feature. FIG. 8C is a schematic view showing the extreme ultraviolet exposure versus the critical dimension of the pattern feature according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography systems and methods. More particularly, it is related to extreme ultraviolet lithography (EUVL) tools and methods of controlling the positioning of reticle masking blades. In an EUVL tool, a laser-produced plasma (LPP) generates extreme ultraviolet radiation which is used to pattern a photoresist layer on a substrate. In an EUV tool, an excitation laser heats metal (e.g., tin, lithium, etc.) target droplets in the LPP chamber to ionize the droplets to plasma which emits the EUV radiation. For reproducible generation of EUV radiation, the target droplets arriving at the focal point (also referred to herein as the "zone of excitation") have to be substantially the same size and arrive at the zone of excitation at the same time as an excitation pulse from the excitation laser arrives. Thus, stable generation of target droplets that travel from the target droplet generator to the zone of excitation at a uniform (or predictable) speed contributes to efficiency and stability of the LPP EUV radiation source. In embodiments of the present disclosure target droplets are reproducibly generated and the target droplets travel at a uniform speed and without a change in their size or shape.

Figure 1:
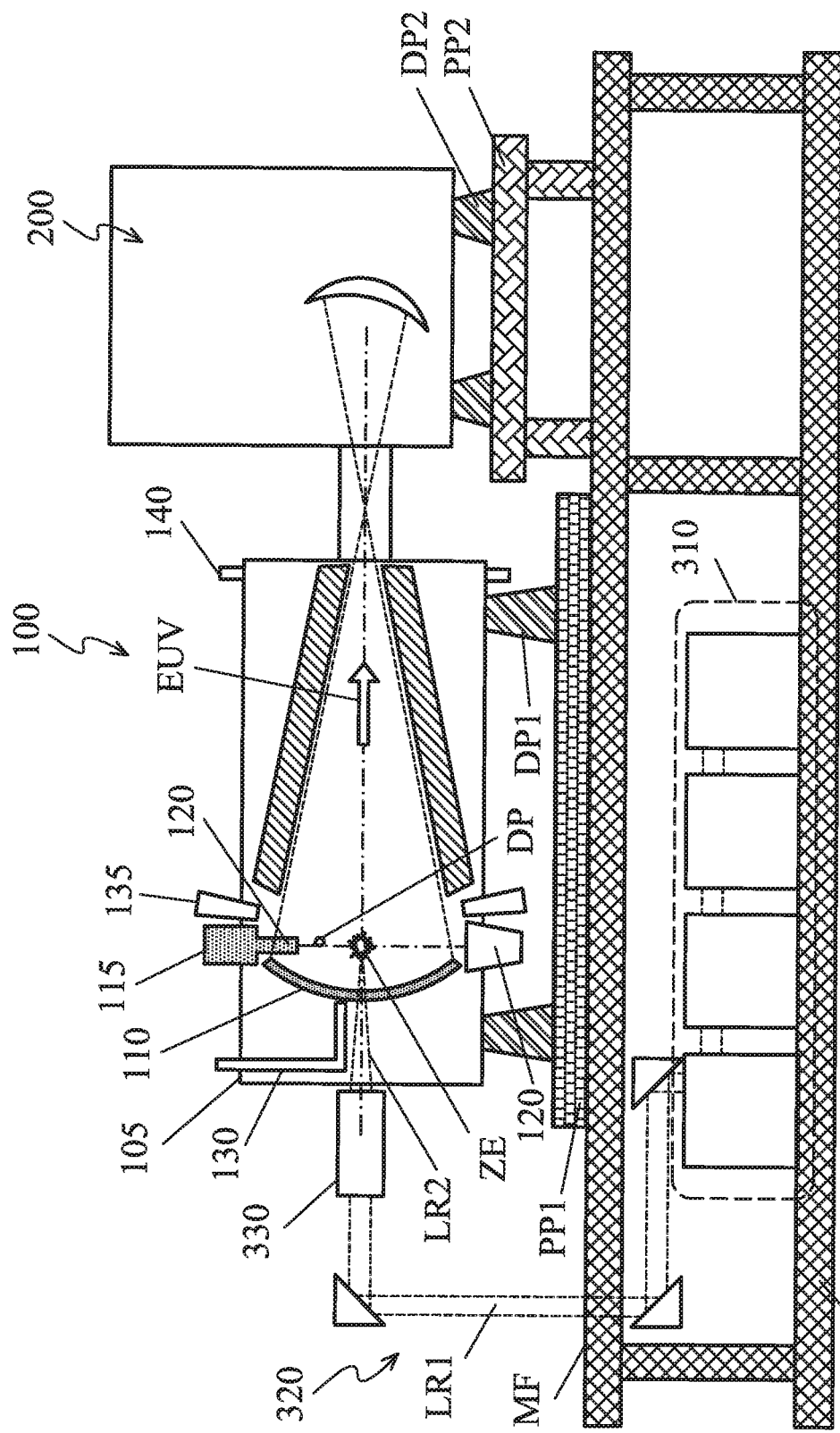
FIG. 1 shows an extreme ultraviolet lithography tool according to an embodiment of the disclosure.

FIG. 1 is a schematic view of an EUV lithography tool with a laser production plasma (LPP) based EUV radiation source, constructed in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 2:
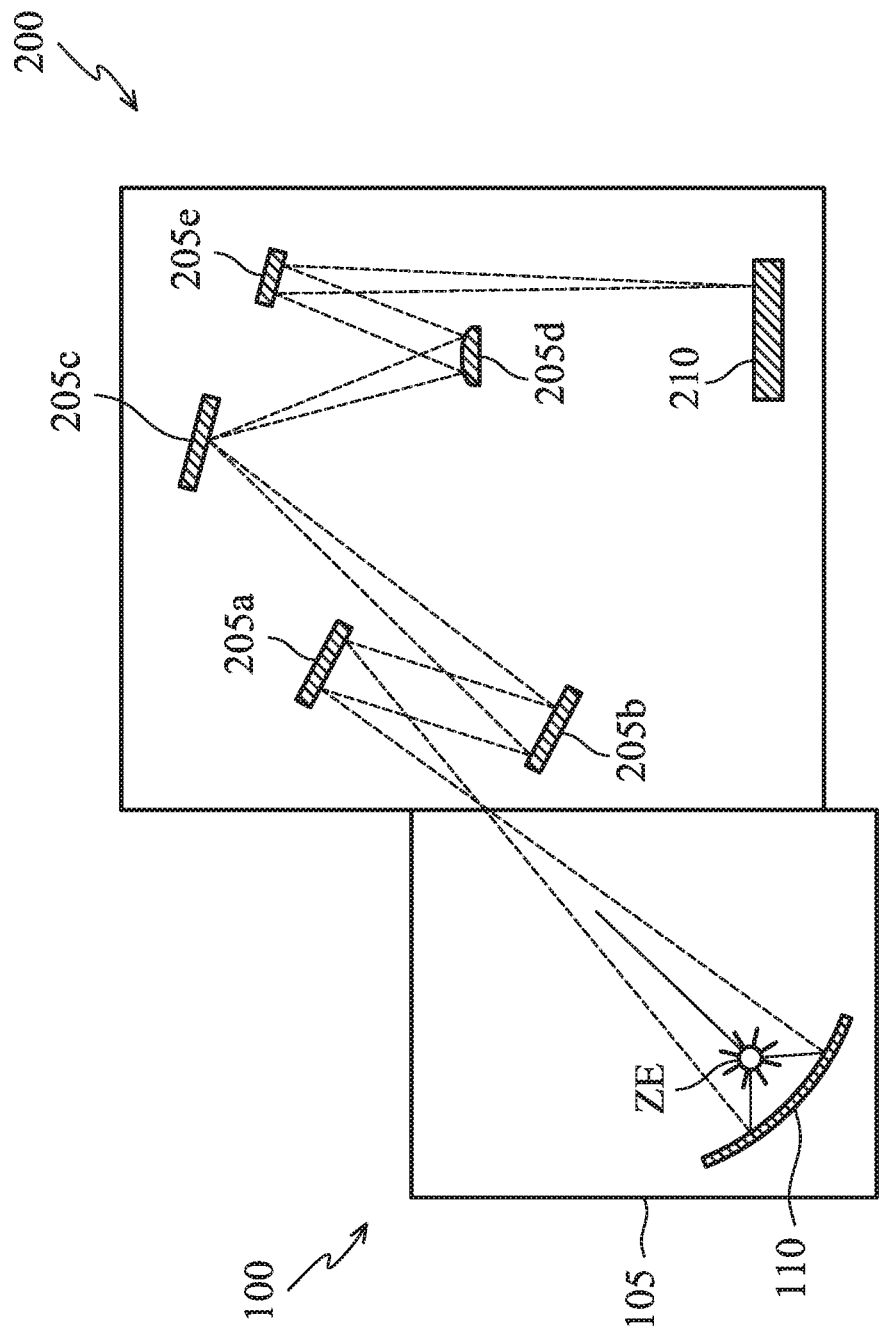
FIG. 2 shows a schematic diagram of an extreme ultraviolet lithography tool according to an embodiment of the disclosure.

FIG. 2 is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV light source 100 including plasma at ZE emitting EUV light in a chamber 105 that is collected and reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is not meant to be limited to components which operate solely within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the patterning optic 205c shown in FIG. 3 is a reflective reticle. In an embodiment, the reflective reticle 205c includes a substrate 30 with a suitable material, such as a low thermal expansion material or fused quartz, as shown in FIG. 3. In various examples, the material of the substrate 30 includes $TiO_2$ doped $SiO_2$, or other suitable materials with low thermal expansion. The reflective reticle 205c includes multiple reflective multiple layers (ML) 35 deposited on the substrate. The ML 35 includes a plurality of film pairs, such as molybdenum-silicon (Mo/Si) film pairs (e.g., a layer of molybdenum 39 above or below a layer of silicon 37 in each film pair). Alternatively, the ML 35 may include molybdenum-beryllium (Mo/Be) film pairs, or other suitable materials that are configured to highly reflect the EUV light. The reticle 205c may further include a capping layer 40, such as ruthenium (Ru), disposed on the ML for protection. The mask further includes an absorption layer 45, such as a tantalum boron nitride (TaBN) layer, deposited over the ML 35. The absorption layer 45 is patterned to define a layer of an integrated circuit (IC). The reflective reticle 205c includes a conductive backside coating 60. Alternatively, another reflective layer may be deposited over the ML 35 and is patterned to define a layer of an integrated circuit, thereby forming an EUV phase shift reticle.

In another embodiment, as shown in FIG. 4, the reflective reticle 205c includes a border 65 etched down to the substrate 30 surrounding the pattern 55, also known as a black border 65, to define a circuit area to be imaged and a peripheral area not to be imaged. The black border reduces light leakage in some embodiments.

In various embodiments of the present disclosure, the photoresist coated substrate 210 is a semiconductor wafer, such as a silicon wafer or other type of wafer to be patterned.

The EUVL tool further include other modules or is integrated with (or coupled with) other modules in some embodiments.

As shown in FIG. 1, the EUV radiation source 100 includes a target droplet generator 115 and a LPP collector 110, enclosed by a chamber 105. In some embodiments, the target droplet generator 115 includes a reservoir to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz). In some embodiments, the target droplets DP are supplied at an ejection-frequency of about 100 Hz to a about 25 kHz. In other embodiments, the target droplets DP are supplied at an ejection frequency of about 500 Hz to about 10 kHz. The target droplets DP are ejected through the nozzle 120 and into a zone of excitation ZE at a speed in a range of about 10 meters per second (m/s) to about 100 m/s in some embodiments. In some embodiments, the target droplets DP have a speed of about 10 m/s to about 75 m/s. In other embodiments, the target droplets have a speed of about 25 m/s to about 50 m/s.

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure device 200. A droplet catcher 125 is used for catching excessive target droplets. For example, some target droplets may be purposely missed by the laser pulses.

Referring back to FIG. 1, the collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure device 200.

As shown in FIG. 1, in the present embodiment, a buffer gas is supplied from a first buffer gas supply 130 through the aperture in collector 110 by which the pulse laser is delivered to the tin droplets. In some embodiments, the buffer gas is $H_2$, He, Ar, N or another inert gas. In certain embodiments, $H_2$ used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140.

Figure 5:
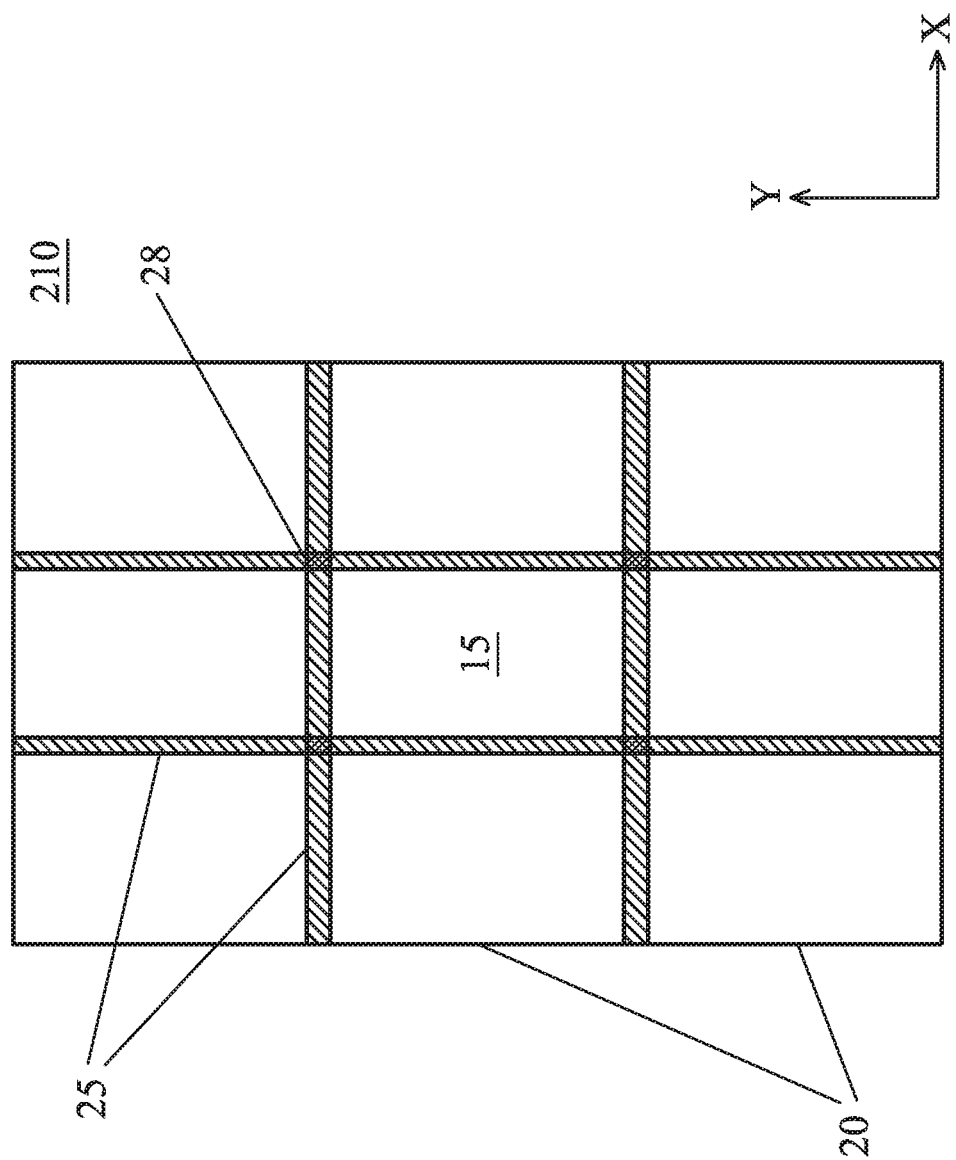
FIG. 5 is a plan view of extreme ultraviolet exposed regions on a semiconductor substrate according to embodiments of the disclosure.

In some embodiments, a first area of the photoresist coated semiconductor substrate 210 is exposed to extreme ultraviolet radiation reflected off the reflective reticle 205c to form a first exposure (scan) area 15, as shown in FIG. 5. In some embodiments, the photoresist coated semiconductor substrate 210 is located on a movable stage 98 (see FIG. 10) which moves the photoresist coated semiconductor substrate 210 to a new location after each exposure so that substantially all of the surface area of the semiconductor substrate 210 is used to form semiconductor devices. As different portions of the photoresist coated semiconductor substrate 210 are imaged, there is undesired overlap of exposed areas in immediately adjacent areas of the photoresist coated semiconductor substrate 210 due to a penumbra of imaging light. As shown in FIG. 5, second exposure areas 20 surrounding the first exposure area 15 have overlap areas at the borders 25 where reflections of penumbral light from exposures of the first and second exposure areas overlap. Thus, border areas 25 receive several exposures, which could lead to degradation of the critical dimension in or around the border areas 25. In the corners 28 of the exposure areas, the corner regions receive exposure radiation from four exposures. The exposure areas are illustrated as substantially rectangular-shaped, though the present disclosure is not limited to rectangular-shaped exposure areas.

A detail of the first exposure area 15 is shown in FIG. 6. The central area 18 of the first exposure area 15 receives one exposure dose. The border region 25 of the first exposure area 15 receives additional exposure doses due to the penumbra of imaging light and the corner regions 28 receive further exposure doses due to the penumbra of imaging light. In some embodiments the width of the overlapping border region 25 ranges from about 50 μm to about 500 μm in the X and Y-directions. In some embodiments, the width of the overlapping border region ranges from about 200 μm to about 400 μm. In some embodiments, the amount of overlap is greater in one direction than the other direction. For example, in some embodiments, the amount overlap in the X direction, W2, is about 250 μm and the amount of overlap in the Y-direction, W1, is about 350 μm.

FIG. 7A is schematic view of an ideal extreme ultraviolet exposure operation. In the ideal case, incoming extreme ultraviolet light 75 reflects off a pattern feature in a reticle 205c and impinges on a photoresist coated substrate 201. Upon development, a sharply defined pattern 510 is formed in the photoresist, as shown.

In some embodiments, reticle masking blades 70 are used to shield light from the image border of a reticle 205c, as shown in FIG. 7B. Reticle masking blades 70 are used to block off sections of the reticle 205c that will not be exposed, and therefore, surround the pattern to be imaged. Reticle masking blades 70 are used to shield light from the image border to allow for printing of densely spaced dies. When dies are printed densely, the image border of each neighboring die overlaps with the edge of a given die resulting in an increase of dose that overexposes features at the edge of the field. This feature is referred to a field edge effect.

Diffraction at the edges of the reticle masking blades 70 creates a penumbra of imaging light 250 on the reticle 205c, as shown in FIG. 7B. In addition, the edges of the reticle masking blades have a surface roughness that influences the size of the penumbra 250. Penumbral light 250 is also reflected from the reticle 205c and the reflected penumbral light 252 exposes the border regions of exposed regions on the photoresist coated substrate 210. The exposure of the border regions by the penumbral light decreases the sharpness of the pattern 520 formed in the photoresist. Variations in the position of the reticle mask blades 70 can introduce substantial overlap of exposure doses in the border regions of the patterns 530 formed in the photoresist coated substrate 210, as shown in FIG. 7C.

FIG. 8A is a schematic view showing the extreme ultraviolet exposure versus the critical dimension of the pattern feature. As shown in the exposed photoresist 540 there is substantial overlap between two adjacent exposure areas. FIG. 8B is a schematic view showing the cumulative extreme ultraviolet exposure versus the critical dimension of the pattern feature. As shown, in the border region of the photoresist 550 between two adjacent exposure areas, the critical dimension of the pattern features increases significantly. On the other hand, as discussed herein, controlling the masking blade positioning according to embodiments of the disclosure, provides photoresist patterns 560 with a substantially uniform critical dimension, as shown in FIG. 8C.

Optical proximity correction (OPC) is used in some embodiments to compensate for image errors due to diffraction or process effects. In some embodiments, the reticle masking blade positioning is controlled to minimize the impact on critical dimension uniformity while optical proximity correction is implemented.

Figure 9:
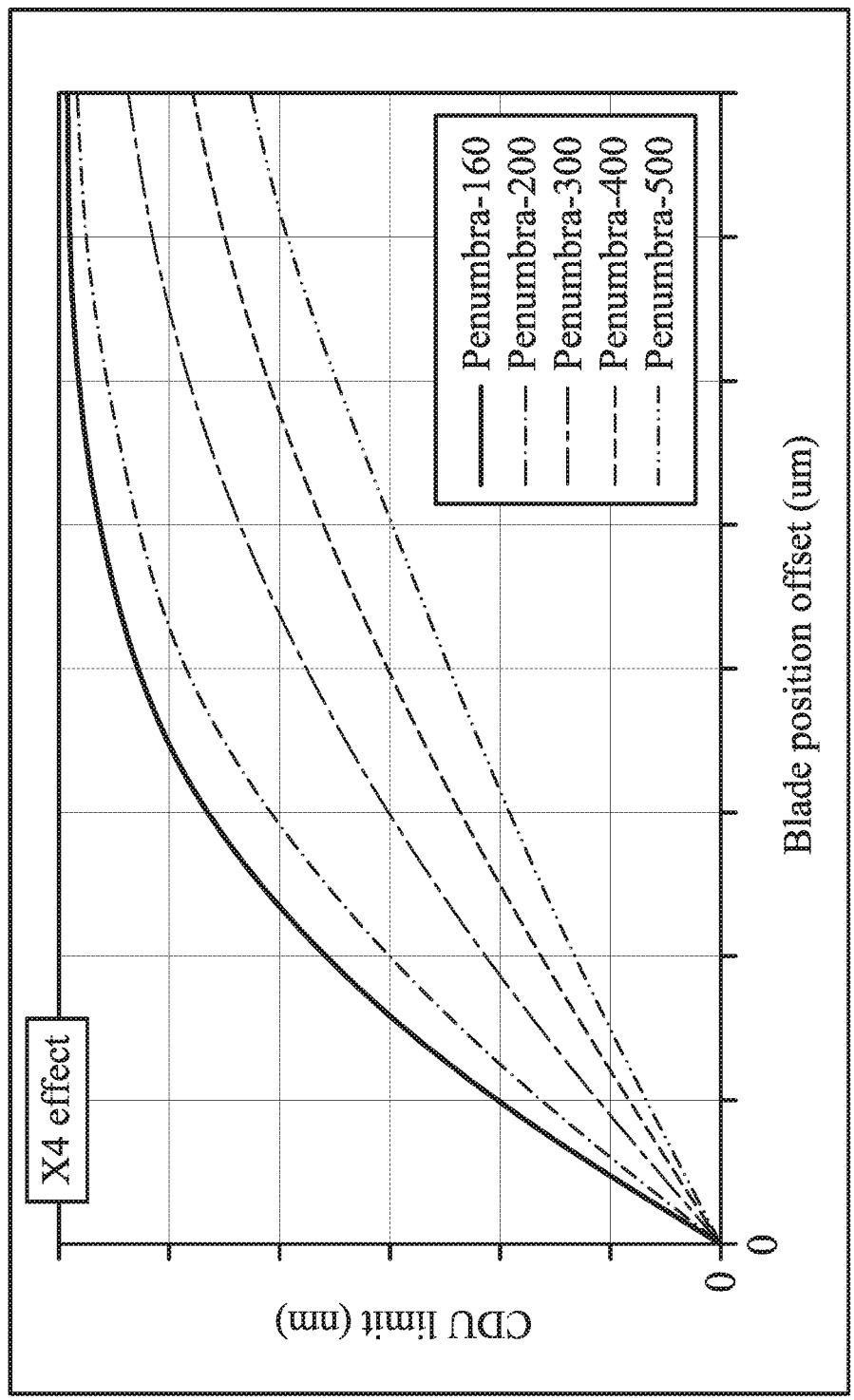
FIG. 9 is a graph showing the effect of reticle masking blade offset on the critical dimension formed on a substrate to be patterned.

FIG. 9 is a graph showing the effect of reticle masking blade offset on the critical dimension formed on a substrate to be patterned. The graph shows the effect of reticle masking blade offset at several different penumbra widths measured in microns. As the amount of reticle masking blade offset decreases the amount of variation in the critical dimension uniformity decreases.

Figure 10:
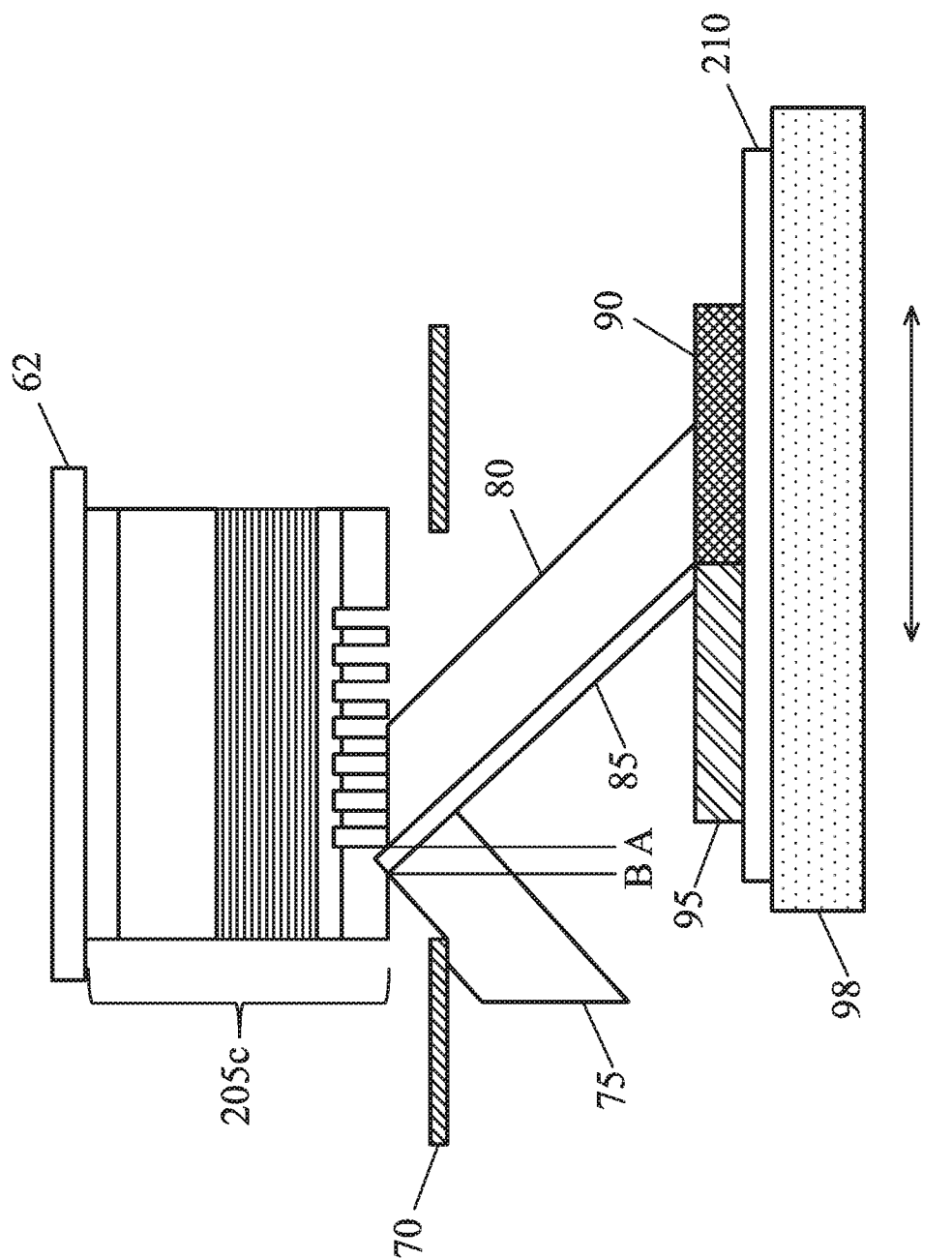
FIG. 10 is a schematic view of extreme ultraviolet imaging according to an embodiment of the disclosure.

Reticle masking blades 70 (see FIG. 10) are used to block off sections of the reticle 205c that will not be exposed, and therefore, surround the pattern to be imaged. As shown in FIG. 10, the reflective reticle 205c is supported by a reflective reticle support stage 62. Extreme ultraviolet light 75 from an EUV light source reflects off the reticle 205c and the reflected light 80 exposes a first region 90 on the semiconductor substrate 210, which is supported by a movable stage 98.

Figure 11:
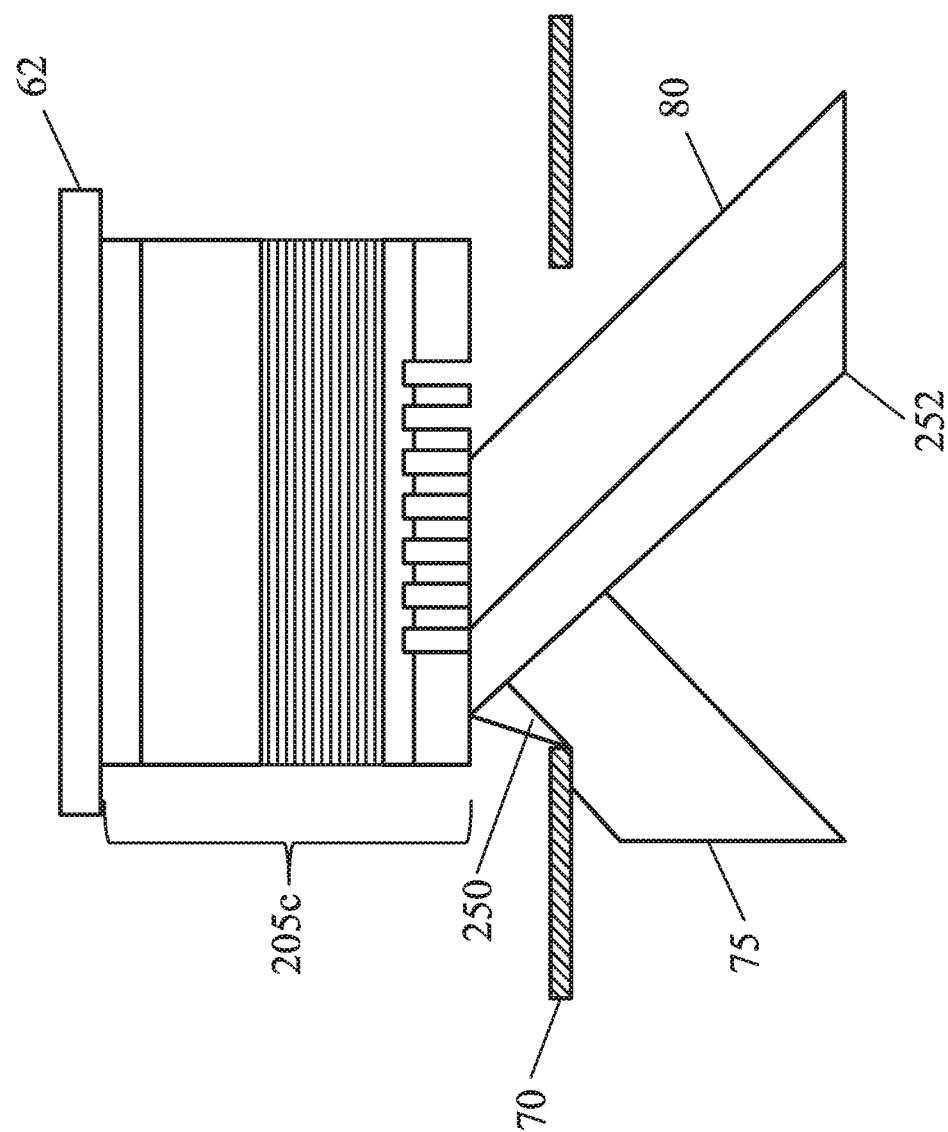
FIG. 11 is a schematic view of extreme ultraviolet imaging according to an embodiment of the disclosure showing the penumbra generated by the extreme ultraviolet beam and a reticle masking blade.

Because the masking blade 70 cannot be reproducibly set with precision in the same position so that incoming exposure radiation 75 only impinges on the image field of the reflective reticle 205c (position A), a portion of the incoming radiation 75 exposes the image border between positions A and B and is reflected so that the portion of the radiation 85 reflected from the image border overlaps a portion of neighboring region 95 on the photoresist coated substrate 210. The reticle masking blade positions have tolerances associated with them and are not necessarily placed in the same location every time. Diffraction at the edges of the reticle masking blades 70 creates a penumbra of imaging light 250 on the reticle 205c, as shown in FIG. 11. In addition, the edges of the reticle masking blades have a surface roughness that influences the size of the penumbra 250. Penumbral light 250 is also reflected from the reticle 205c and the reflected penumbral light 252 exposes the border regions 25 (FIG. 6) of exposed regions on the photoresist coated substrate 210.

As shown in FIG. 9, decreasing the reticle masking blade position offset improves the critical dimension uniformity of the patterned images on a photoresist coated semiconductor substrate. For example, if the reticle masking blade offset is controlled to within 100 microns the critical dimension uniformity can be controlled to within 1 nm. In addition, increasing the penumbra size improves critical dimension uniformity. As the penumbra 250 is increased the light in the penumbra becomes more spread out, in other words, the intensity of the penumbral light is decreased, thus less light from the penumbra 250 is reflected off the border of the reticle 205c and reaches the photoresist. If the reflected light is below a threshold intensity, it will not be sufficient to initiate the photochemical reaction in the photosensitive material in the photoresist, thereby limiting unwanted photoresist imaging in the border regions 25 (FIG. 6) of the exposed regions.

Figure 12:
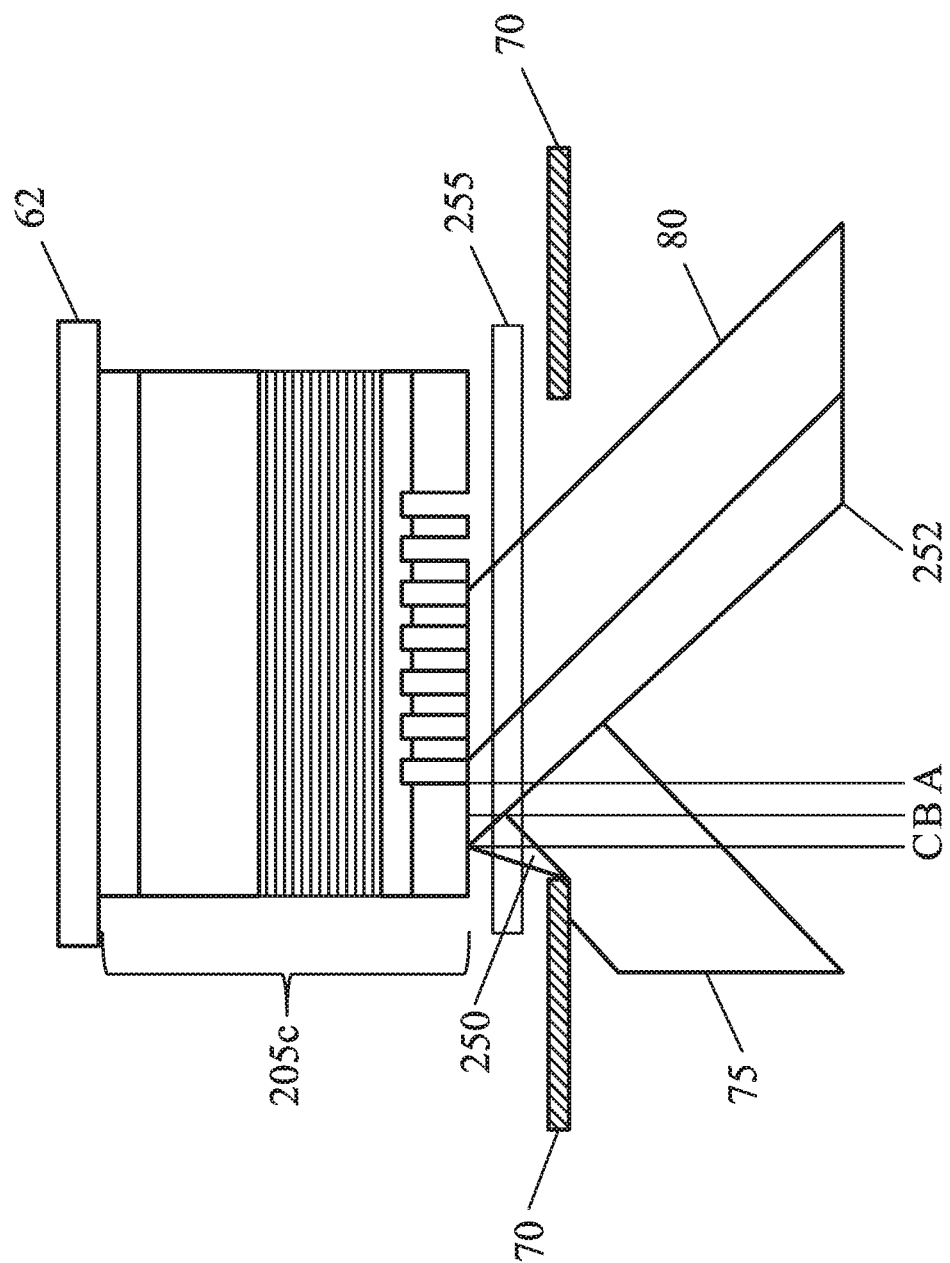
FIG. 12 is a schematic view of extreme ultraviolet imaging according to an embodiment of the disclosure including a pellicle.

Another contributor to degradation of critical dimension uniformity is out-of-band (OoB) radiation. EUV light sources are designed to emit 13.5 nm radiation, however they also emit OoB radiation, especially in the deep ultraviolet (DUV) range. In some embodiments, a pellicle 255 is placed between the reflective reticle 205c and the reticle masking blades 70 to protect the reticle from contamination. A pellicle 255 protecting reticle 205c from contamination is shown in FIG. 12. The pellicle 255 is about a 25 nm to about 125 nm thick layer of material that is transparent to extreme ultraviolet light. In some embodiments, the pellicle 255 is made of SiC, polysilicon, silicon nitride, or graphene. The pellicle 255 has a drawback in that it reflects DUV radiation. Therefore, OoB DUV radiation generated by the EUV light source is reflected towards the photoresist coated substrate 210 (FIG. 10). Because most EUV photoresists are also sensitive to OoB DUV radiation, longer wavelength DUV radiation (longer than EUV radiation) reflected off of the pellicle towards the photoresist coated substrate will degrade the critical dimension uniformity in some embodiments. The reflection of the DUV radiation off the pellicle 255 is illustrated in FIG. 12, as the portion of the penumbra 255 between positions B and C. The DUV radiation reflected off the pellicle 255 enhances the penumbra 252 impinging on the photoresist coated substrate 210 in some embodiments. Properly positioned reticle masking blades alleviate the deleterious effects of OoB DUV radiation.

Figure 13:
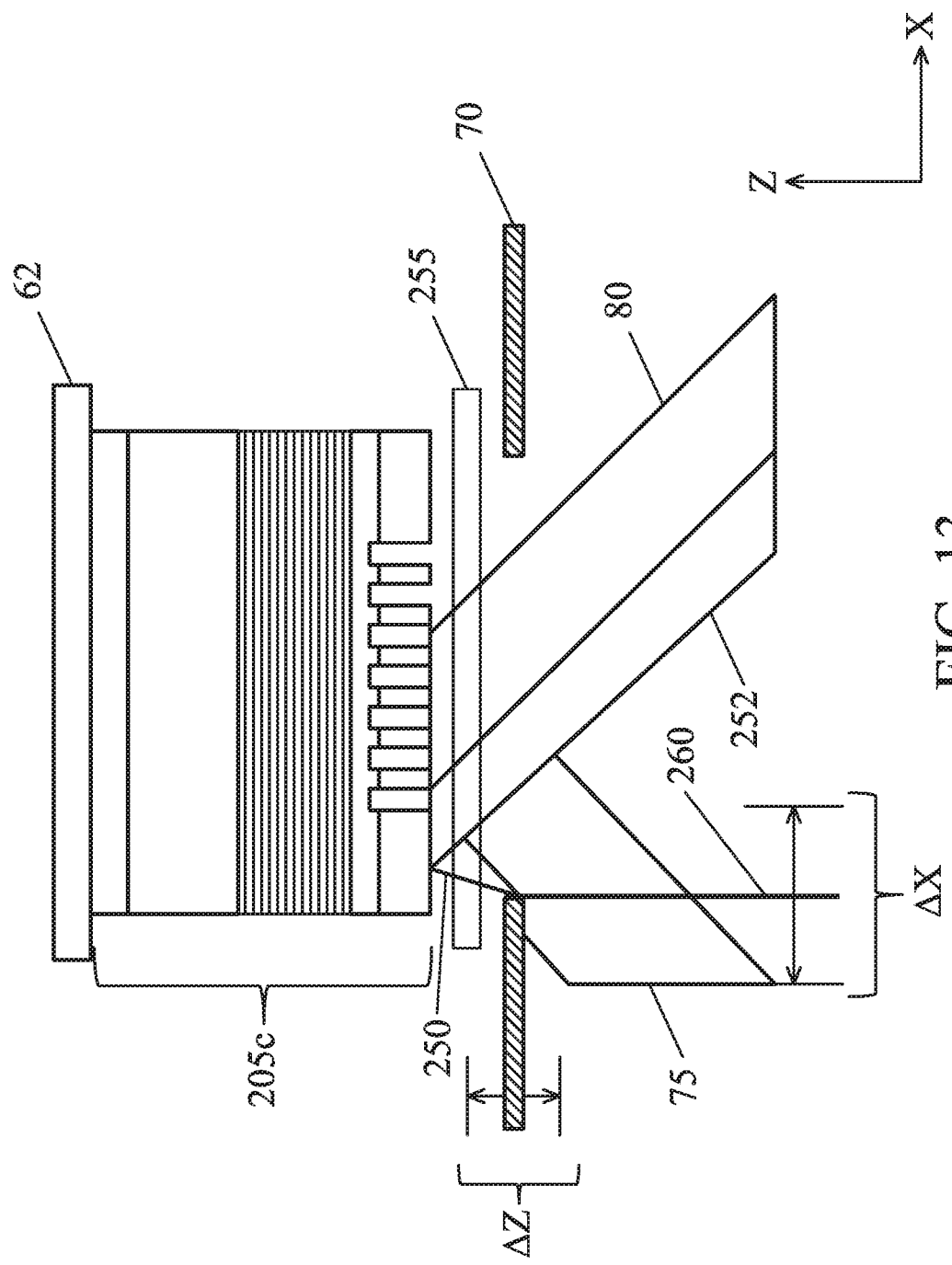
FIG. 13 is a schematic view of extreme ultraviolet imaging showing a variance in reticle masking blade position.

As shown in FIG. 13, there is a variance in the position of reticle masking blades 70 each time the EUV tool is reset. The target position 260 of the reticle masking blade 70 is shown. The target position 260 is determined in accordance with mask data before the start of a production run when a new reticle is installed in the tool. The target position can be determined by exposing portions of a photoresist coated substrate and adjusting the position of the reticle masking blade between exposures and then analyzing the imaged pattern formed and determining which position provides the best results. The position of the reticle masking blade may vary in the horizontal plane (X-Y plane) $\Delta X$, or in the vertical direction (Z-direction) $\Delta Z$. Offset in the horizontal plane has a greater effect on critical dimension uniformity than variation in the Z-direction.

Figure 14:
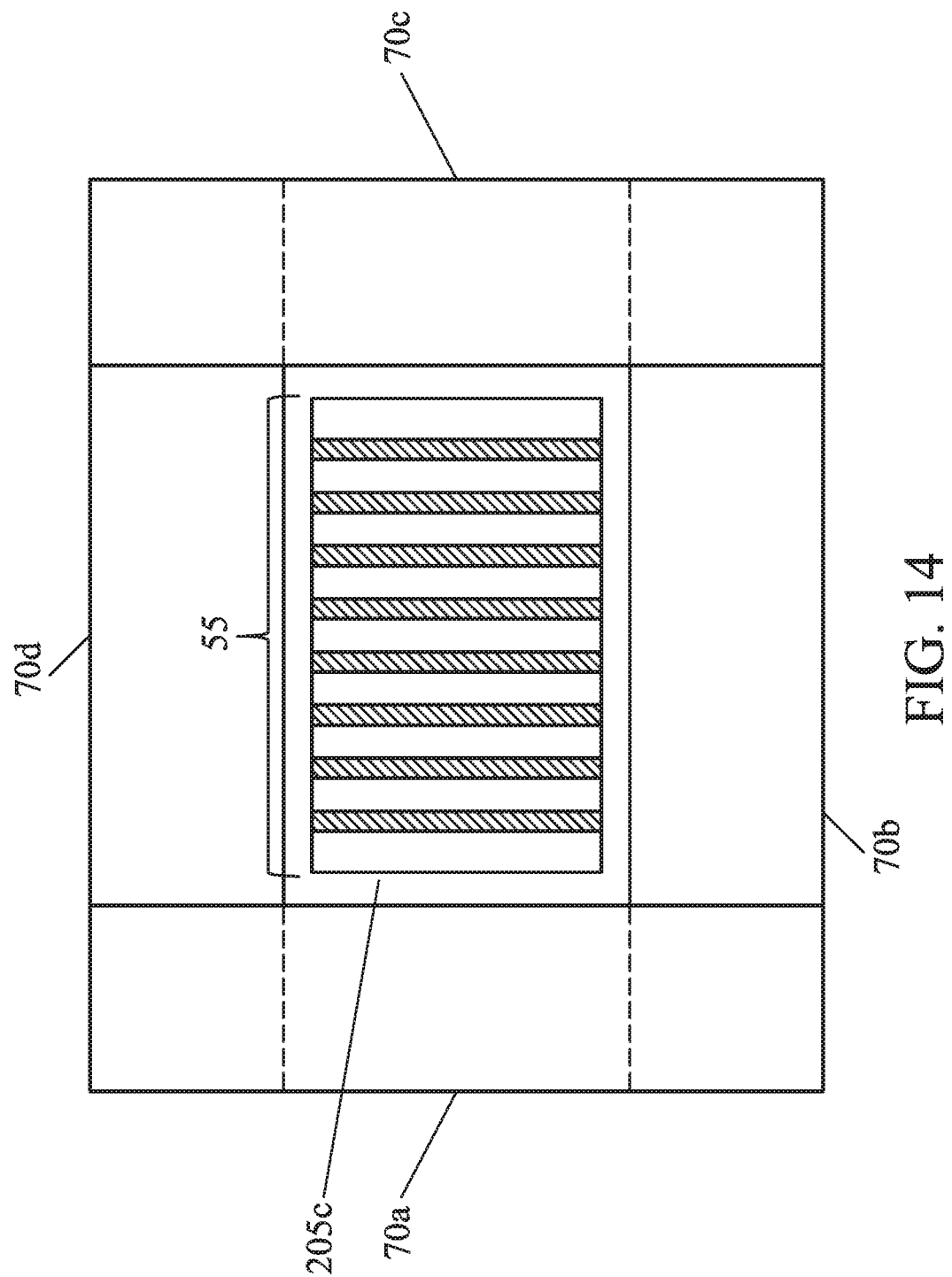
FIG. 14 is a plan view of reticle masking blades according to embodiments of the present disclosure.

FIG. 14 is a plan view of reticle masking blades 70 according to embodiments of the present disclosure, in a direction looking up at the reticle 205c through the reticle masking blades opening. In this embodiment, four reticle masking blades 70a, 70b, 70c, 70d are arranged overlapping each other to provide a rectangular opening exposing the pattern 55 in the reticle 205c.

Figure 15:
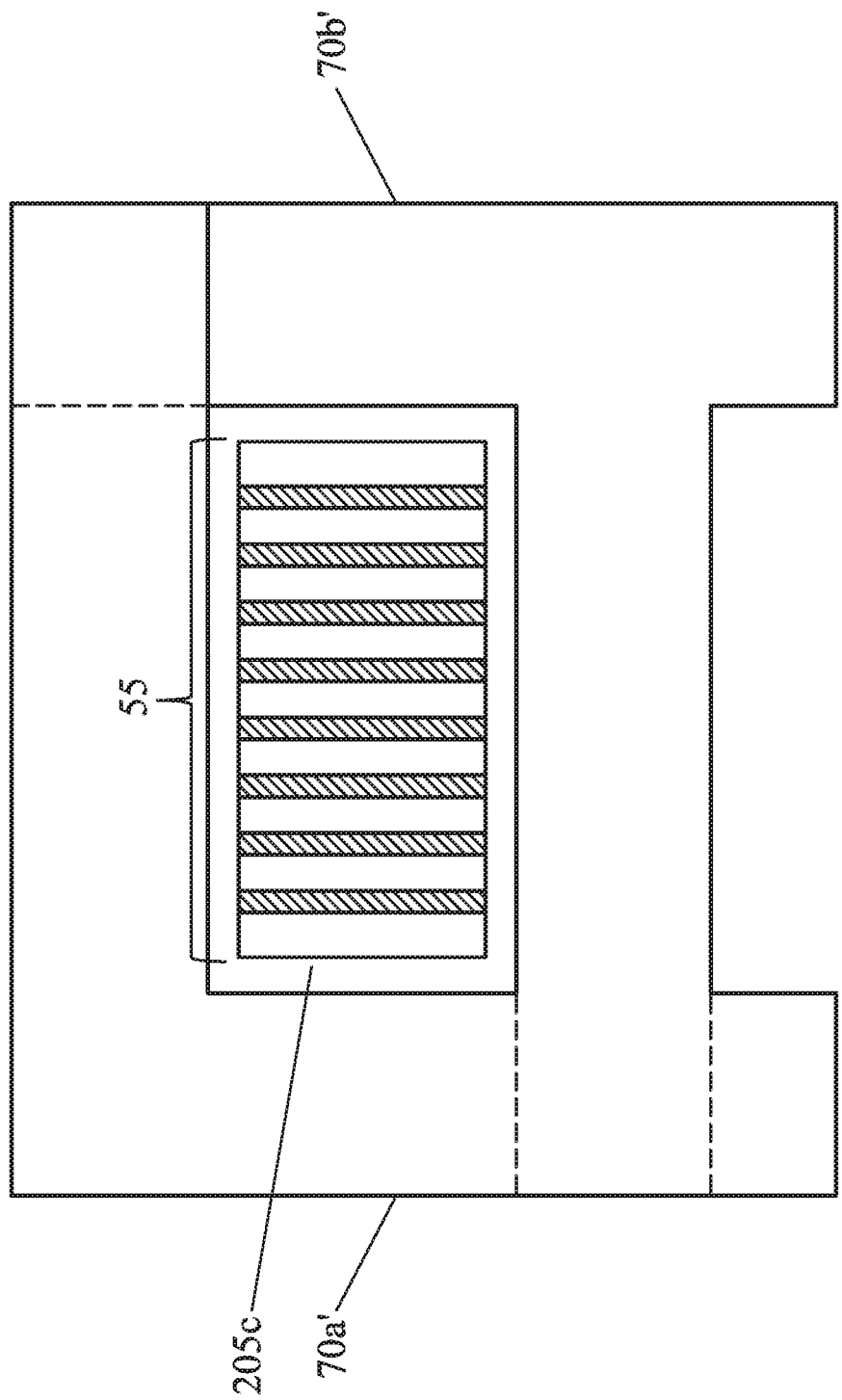
FIG. 15 is a plan view of reticle masking blades according to embodiments of the present disclosure.

In another embodiment, as shown in FIG. 15, two reticle masking blades 70a' and 70b' are configured to provide a rectangular opening exposing the pattern 55 in the reticle 205c. FIG. 15 is a plan view in a direction looking up at the reticle 205c through the reticle masking blades opening. In the embodiments shown in FIGS. 14 and 15, the positioning of each blade is individually controlled in some embodiments.

Figure 16:
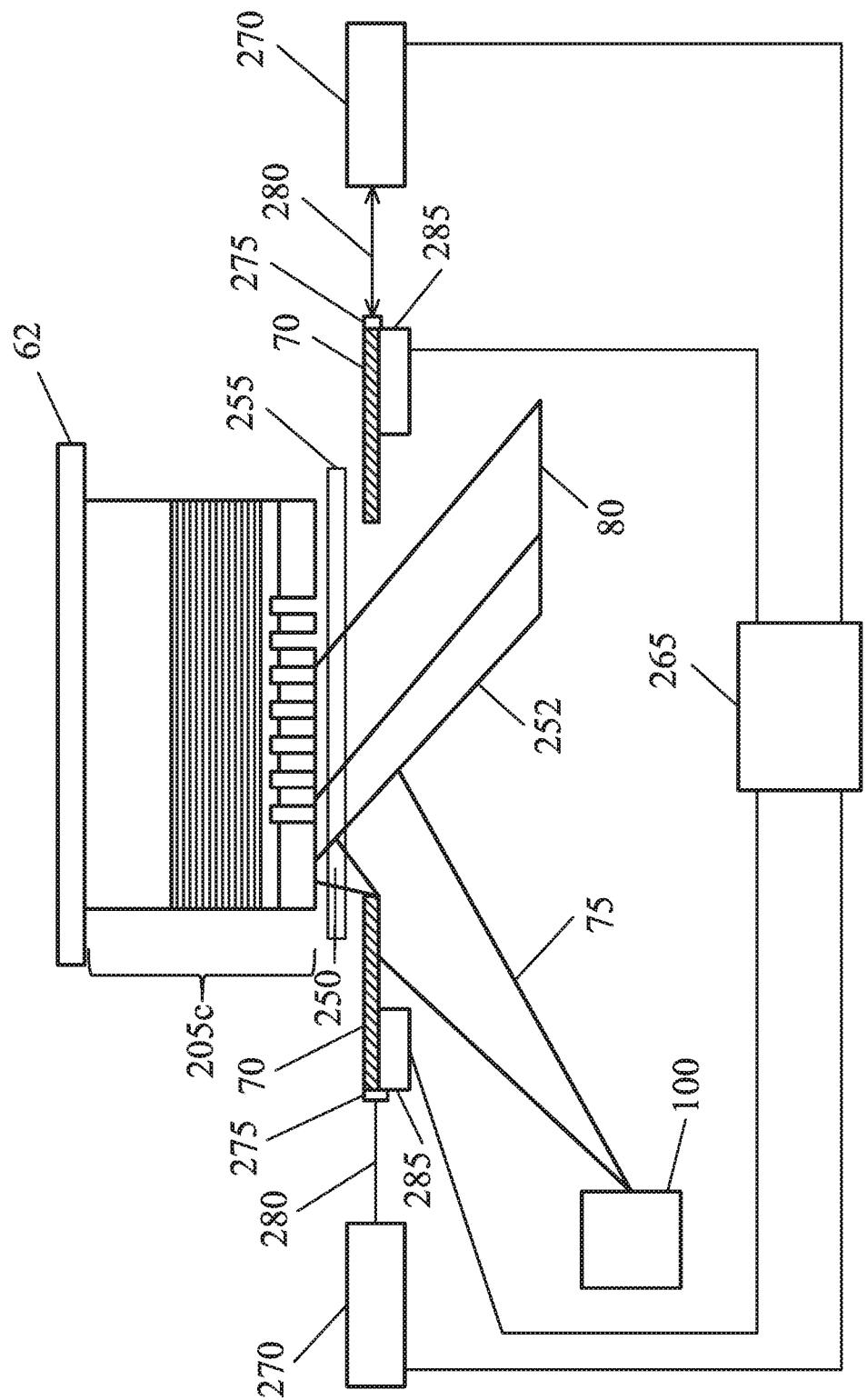
FIG. 16 shows a device for controlling reticle mask blade positioning according to embodiments of the disclosure.

FIG. 16 shows a device for controlling reticle mask blade positioning according to embodiments of the disclosure. The position of each reticle masking blade 70 is individually controlled by a controller 265. A position sensor 270 senses the position of each of the reticle masking blades 70 in some embodiments. In some embodiments, the position sensor 270 optically senses the position of the reticle masking blades 70. In some embodiments, the position sensor 270 is a laser interferometer. Laser interferometry can provide nanometer scale precision in determining the location of an object, such as the reticle masking blades. In some embodiments, a reflector 275, such as a mirror, is attached to the reticle masking blade 70. The position sensor 270 directs a beam of light 280, such as a laser, at the reflector 275, and the beam of light is reflected back at the position sensor 270. When the position sensor 270 is a laser interferometer, the position sensor 270 uses interferometry to accurately determine the location of the reticle masking blades 70. The controller 265 analyzes the reticle masking blade position data and if the reticle masking blades 70 are outside of a set position tolerance the controller activates actuators 285 to move the reticle masking blades 70 to a new position. The controller 265 uses a feedback loop to continuously monitor and adjust the position of the reticle masking blades 70 to be located at the correct positions during the exposure process in some embodiments. In some embodiments, one or more actuators 285 are coupled to each reticle masking blade 70 to move the reticle masking blade 70 in the horizontal or vertical directions.

Figure 17:
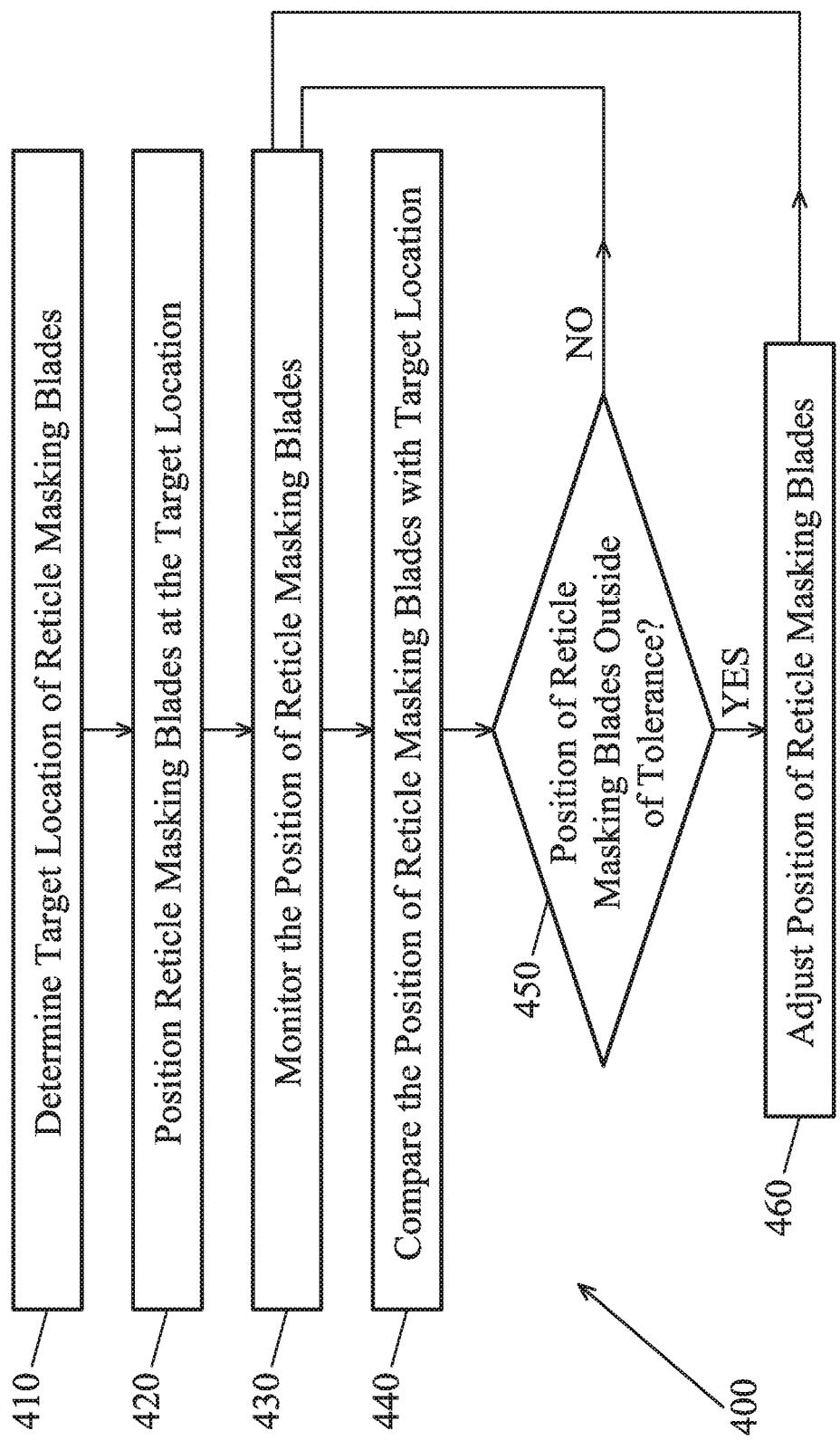
FIG. 17 is a flow chart of a method of controlling reticle mask blade positioning according to an embodiment of the disclosure.

FIG. 17 is a flow chart of a method 400 of controlling reticle mask blade positioning according to an embodiment of the disclosure. For illustration purposes, the operations in the method 400 can be described with reference to various elements and features shown in FIGS. 6 and 16. In operation 410, the target location of the reticle masking blades is determined. The target location can be determined for a given set of reticle masking blades 70 and reflective reticle 205c. A series of exposures of a photoresist coated semiconductor substrate at different reticle masking blade positions can be taken and after developing the photoresist, the photoresist pattern can be analyzed to determine which reticle masking blade position gives the optimum results. In some embodiments, the reticle masking blade position is optimized to minimize the variation in penumbral exposure dose in the border regions 25 and corner regions 28 (FIG. 6).

In operation 420 the reticle masking blades are positioned at the target location based on the optimum location determined in operation 410. During the EUV exposure process, the position of the reticle masking blades 70 is monitored by position sensors 270 in some embodiments. The position of the reticle masking blades 70 is compared with the target location in operation 440. In some embodiments, a controller 265 is used to compare the position of the reticle masking blades 70 with the target location. If the positions of the reticle masking blade 70 are outside the tolerance for the location of the masking blades the position of the reticle masking blades 70 are adjusted by actuators 285 in operation S460. If the positions of the reticle masking blades 70 are within the tolerances the position sensor 270 continues to monitor the position of the reticle masking blades 70. After the actuators 285 adjust the position of the reticle masking blades 70, the position sensors 270 also continue to monitor the position of the reticle masking blades 70, and the controller 265 determines whether further adjustments are necessary. In some embodiments, the controller 265 uses a feedback loop to continuously monitor and adjust the positions of the reticle masking blades 70. In some embodiments, the position of the reticle masking blades are periodically measured, such as after a certain number of substrates are imaged or after a set period of time.

The methods of controlling reticle masking blade positioning, manufacturing a semiconductor device, and device for controlling the position of a reticle masking blade according to embodiments of the present disclosure provide improved critical dimension uniformity. In some embodiments, the exposure doses of exposure regions at various locations of the substrate are substantially the same, even in border and corner areas where penumbral light reflections overlap. In some embodiments, controlling the reticle masking blade offset to within 100 microns provides critical dimension uniformity to within 1 nm.

An embodiment of the present disclosure is a method of controlling reticle masking blade positioning to minimize the impact on critical dimension uniformity. The method includes determining a target location of a reticle masking blade relative to a reflective reticle, and positioning the reticle masking blade at the target location. A position of the reticle masking blade is monitored during an imaging operation. The position of the reticle masking blade is compared with the target location, and the position of the reticle masking blade is adjusted if the position of the reticle masking blade is outside a tolerance of the target location. In an embodiment, the monitoring is performed using a position sensor. In an embodiment, the monitoring is performed using laser interferometry. In an embodiment, the adjusting the position of the reticle masking blade includes activation of one or more actuators mechanically coupled to the reticle masking blade. In an embodiment, the monitoring the position of the reticle masking blades, the comparing the position of the reticle masking blades, and the adjusting the position of the reticle masking blades are performed using a controller. In an embodiment, the controlling the masking blade positioning is performed while implementing optical proximity correction. In an embodiment, the method includes adjusting the position of the masking blade to adjust the size of a penumbra of radiation reflected off the reflective reticle. In an embodiment, the adjusting the reticle masking blade includes adjusting the reticle masking blade in a direction parallel to a main surface of the reflective reticle or adjusting the reticle masking blade in a direction perpendicular to a main surface of the reflective reticle.

Another embodiment of the present disclosure is a device for controlling an exposure area in an extreme ultraviolet lithography tool. The device includes an extreme ultraviolet radiation source and a moveable stage for supporting a photoresist coated substrate. One or more reticle masking blades is located between the extreme ultraviolet radiation source and a reflective reticle support stage. One or more actuators coupled with the one or more reticle masking blades is configured to move the reticle masking blades. A position sensor is configured to determine positions of the one or more reticle masking blades. In an embodiment, the device includes a controller configured to control the position sensor and the one or more actuators. In an embodiment, the position sensor includes a laser interferometer. In an embodiment, the one or more actuators are configured to move the reticle masking blades in a direction parallel to a main surface of the reflective reticle support stage or in a direction perpendicular to a main surface of the reflective reticle support stage. In an embodiment, the one or more reticle masking blades include two to four reticle masking blades arranged to form a substantially rectangular opening. In an embodiment, the position sensor is configured to direct a light beam to the one or more reticle masking blades and the one or more reticle masking blades is configured to reflect the light beam from the position sensor. In an embodiment, the device includes a pellicle located between the one or more reticle masking blades and the reflective reticle support stage.

Another embodiment of the present disclosure is an extreme ultraviolet lithography tool including an extreme ultraviolet radiation source and a moveable stage for supporting a photoresist coated substrate. One or more reticle masking blades are located between the extreme ultraviolet radiation source and a reflective reticle support stage. A position sensor is configured to monitor a position of the one or more reticle masking blades during a selective photoresist exposing operation. One or more actuators is configured to adjust the position of the one or more reticle masking blades if the one or more reticle masking blades are outside a set tolerance range. A controller is configured to determine whether the one or more reticle masking blades are located within the set tolerance range, and configured to control the actuators. In an embodiment, the controller is configured to control the position sensor, compare the position of the one or more reticle masking blades, and adjust the position of the reticle masking blades. In an embodiment, a pellicle is located between the one or more reticle masking blades and the reflective reticle support stage. In an embodiment, the extreme ultraviolet lithography tool includes a plurality of optics configured to direct the extreme ultraviolet radiation toward the movable stage. In an embodiment, the one or more reticle masking blades include two to four reticle masking blades.

Another embodiment of the present disclosure is a method of manufacturing a semiconductor device using an extreme ultraviolet lithography tool. The extreme ultraviolet lithography tool includes: an extreme ultraviolet radiation source, a moveable stage for supporting a photoresist coated substrate, a reflective reticle support stage, one or more reticle masking blades located between the extreme ultraviolet radiation source and the reflective reticle support stage. The one or more reticle masking blades are positioned at a first location within a set tolerance range. The method includes selectively exposing a first region of the photoresist coated substrate to extreme ultraviolet radiation reflected off the reflective reticle in the extreme ultraviolet lithography tool. The position of the reticle masking blades is monitored during the selective exposing operation. Whether one or more of the reticle masking blades are located within the set tolerance range is determined. The position of the one or more reticle masking blades is adjusted if the one or more reticle masking blades are outside the set tolerance range. In an embodiment, a controller is configured to control the monitoring the position of the reticle masking blades, compare the position of the reticle masking blades, and adjust the position of the reticle masking blades. In an embodiment, at least one second region of a photoresist coated substrate is selectively exposed and the at least one second region borders the first region. In an embodiment, a penumbral reflection generated during the exposure of the first region and the exposure of the second region overlap at a border region of the first region and the second region. In an embodiment, the position of the reticle masking blades is controlled so that the first region and the second region receive substantially the same exposure dose.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of controlling reticle masking blade positioning to minimize the impact on critical dimension uniformity, comprising:
   determining a target location of two reticle masking blades relative to a reflective reticle having a reticle pattern;
   positioning the reticle masking blades at the target location so that the two reticle masking blades are arranged to form a substantially rectangular opening exposing the reticle pattern;
   monitoring a position of the reticle masking blades during an imaging operation;
   comparing the position of the reticle masking blades with the target location;
   adjusting the position of the reticle masking blades if the position of the reticle masking blades are outside a tolerance of the target location; and
   adjusting the position of the masking blades to adjust the size of a penumbra of radiation reflected off the reflective reticle.

2. The method according to claim 1, wherein the monitoring is performed using a position sensor.

3. The method according to claim 1, wherein the monitoring is performed using laser interferometry.

4. The method according to claim 1, wherein the adjusting the position of the reticle masking blades comprises activation of actuators mechanically coupled to the reticle masking blades.

5. The method according to claim 1, wherein the monitoring the position of the reticle masking blades, the comparing the position of the reticle masking blades, and the adjusting the position of the reticle masking blades are performed using a controller.

6. The method according to claim 1, wherein the controlling the masking blades positioning is performed while implementing optical proximity correction.

7. The method according to claim 1, wherein the adjusting the reticle masking blades comprises adjusting the reticle masking blades in a direction parallel to a main surface of the reflective reticle or adjusting the reticle masking blades in a direction perpendicular to the main surface of the reflective reticle.

8. The method according to claim 1, wherein the adjusting the reticle masking blades comprises adjusting the reticle masking blades in a direction perpendicular to a main surface of the reflective reticle.

9. The method according to claim 1, further comprising exposing a photoresist-coated substrate to radiation reflected off the reflective reticle, wherein the substantially rectangular opening exposes an entire patterned portion of the reflective reticle.

10. A device for controlling an exposure area in an extreme ultraviolet lithography tool, comprising:
    an extreme ultraviolet radiation source;
    a moveable stage for supporting a photoresist coated substrate;
    a reticle having a reticle pattern to be imaged in the photoresist;
    two reticle masking blades arranged to form a substantially rectangular opening exposing the reticle pattern located between the extreme ultraviolet radiation source and a reflective reticle support stage;
    actuators coupled with the reticle masking blades configured to move the reticle masking blades,
    wherein the actuators are configured to move the reticle masking blades in a direction parallel to a main surface of the reflective reticle support stage and in a direction perpendicular to a main surface of the reflective reticle support stage; and
    a position sensor configured to determine positions of the reticle masking blades.

11. The device of claim 10, further comprising a controller configured to control the position sensor and the actuators.

12. The device of claim 10, wherein the position sensor includes a laser interferometer.

13. The device of claim 10, wherein the position sensor is configured to direct a light beam to the reticle masking blades and the reticle masking blades are configured to reflect the light beam from the position sensor.

14. The device of claim 10, further comprising a pellicle located between the reticle masking blades and the reflective reticle support stage.

15. The device of claim 10, wherein the controller is further configured to individually control a position of each reticle masking blade.

16. An extreme ultraviolet lithography tool, comprising:
    an extreme ultraviolet radiation source;
    a moveable stage for supporting a photoresist coated substrate;
    a reticle having a reticle pattern to be imaged in the photoresist;
    two reticle masking blades arranged to form a substantially rectangular opening exposing the reticle pattern located between the extreme ultraviolet radiation source and a reflective reticle support stage;
    a position sensor configured to monitor a position of the reticle masking blades during a selective photoresist exposing operation;

actuators configured to adjust the position of the reticle masking blades if the reticle masking blades are outside a set tolerance range, wherein the actuators are configured to move the reticle masking blades in a direction parallel to a main surface of the movable stage and in a direction perpendicular to the main surface of the movable stage; and a controller configured to determine whether the reticle masking blades are located within the set tolerance range, and configured to control the actuators.

17. The extreme ultraviolet lithography tool of claim 16, wherein the controller is configured to control the position sensor, compare the position of the reticle masking blades, and adjust the position of the reticle masking blades.

18. The extreme ultraviolet lithography tool of claim 17, wherein the controller is further configured to control the position of each reticle masking blade.

19. The extreme ultraviolet lithography tool of claim 16, further comprising a pellicle located between the reticle masking blades and the reflective reticle support stage.

20. The extreme ultraviolet lithography tool of claim 16, further comprising a plurality of optics configured to direct the extreme ultraviolet radiation toward the movable stage.

* * * * *